United States Patent

Kato

[11] Patent Number: 5,883,535
[45] Date of Patent: Mar. 16, 1999

[54] SLEW RATE CONTROLLABLE AMPLIFICATION CIRCUIT

[75] Inventor: Fumihiko Kato, Tokyo, Japan

[73] Assignee: NEC Corporation, Tokyo, Japan

[21] Appl. No.: 888,104

[22] Filed: Jul. 3, 1997

[30] Foreign Application Priority Data

Jul. 3, 1996 [JP] Japan .................................. 8-173283

[51] Int. Cl.$^6$ .................................................. H03K 5/12
[52] U.S. Cl. .......................... 327/170; 327/134; 327/561; 327/77; 327/554
[58] Field of Search .................................... 327/134, 170, 327/560, 561, 563, 77, 179, 337, 554

[56] References Cited

U.S. PATENT DOCUMENTS

| | | | |
|---|---|---|---|
| 4,894,620 | 1/1990 | Nagaraj | 327/337 |
| 5,124,593 | 6/1992 | Michel | 327/554 |
| 5,508,649 | 4/1996 | Shay | 327/78 |
| 5,642,063 | 6/1997 | Lehikoinen | 327/544 |
| 5,708,376 | 1/1998 | Ikeda | 327/337 |

*Primary Examiner*—Toan Tran

*Attorney, Agent, or Firm*—Foley & Lardner

[57] ABSTRACT

An amplification circuit is composed of a differential operational amplifier internally containing a current source circuit and having an inverted input connected to an output thereof through a parallel circuit composed of a first switch and a first capacitor. The inverted input is connected to one end of a second capacitor having the other end connected to a signal input terminal through a second switch. A non-inverted input of the differential operational amplifier is connected to a first reference voltage, and the other end of second capacitor is connected through a third switch to a second reference voltage. There is provided a current source generation circuit having a pair of input terminals connected to the non-inverted input and the inverted input of the differential operational amplifier, respectively, and an output connected to supply the internal current source circuit with a voltage value corresponding to a voltage difference between the non-inverted input and the inverted input of the differential operational amplifier, Thus, a slew rate controllable amplification circuit can be realized in which when a large slew rate is required, the current value of the internal current source circuit of the differential operational amplifier can be temporarily increased.

12 Claims, 4 Drawing Sheets

SLEW RATE CONTROLLABLE AMPLIFICATION CIRCUIT

BACKGROUND OF THE INVENTION

1. Field of the Invention

The present invention relates to an amplification circuit composed of a differential operational amplifier, and more specifically to an amplification circuit having a controllable slew rate which can be changed in accordance with a given necessary condition.

2. Description of Related Art

In the prior art, this type of amplification circuit comprises, as shown in FIG. 1, a differential operational amplifier 1 internally containing a current source circuit 10, switches SW71 to SW73, and capacitors C71 and C72, as basic amplification circuits. A slew rate of this amplification circuit is determined by a current value generated in the internal current source circuit 10 on the basis of a fixed output value of a constant current source circuit 70 connected to the internal current source circuit 10. In addition, the shown amplification circuit comprises a signal input terminal TIS7 for receiving an input signal, a reference voltage input terminal TIV7 for receiving a reference voltage, and a signal output terminal TOS7 for outputting an output signal.

As shown in the drawing, an inverted input and an output of the differential operational amplifier 1 are interconnected through a parallel circuit composed of the switch SW1 and the capacitor C71. The inverted input of the differential operational amplifier 1 is connected to one end of the capacitor C72 having the other end connected to the signal input terminal TIS7 through the switch SW72 in series to the capacitor C72. A non-inverted input of the differential operational amplifier 1 is connected to the reference voltage input terminal TIV7, and the output of the differential operational amplifier 1 is connected to the output terminal TOS7. The switch SW73 is connected between the non-inverted input or the differential operational amplifier 1 and the other end of die capacitor C72. Thus, the basic amplification circuit is constructed.

Furthermore, as shown in the drawing, the internal current source circuit 10 internally contained in the differential operational amplifier 1 is connected to a output of the constant current source circuit 70, so that the value of a current flowing through the internal current source circuit 10 remains constant. In this construction, a slew rate of the differential operational amplifier 1 changes in accordance with the value of the current flowing through the internal current source circuit 10. The larger the value of the current is, the larger the slew rate is. Therefore, in order to obtain a large slew rate, the constant current source circuit 70 outputting a large current value is used.

Now, an operation of the amplification circuit shown in FIG. 1 will be described.

When the switches SW71 and SW72 are in a closed condition and the switch SW73 is an open condition, the capacitor C71 is reset, and the capacitor C72 is charged with electric charges of the amount corresponding to an input voltage applied to the signal input terminal TIS7.

In a next period, the switches SW71 and SW72 are brought into an open condition and the switch SW73 is brought into a closed condition, so that the electric charge stored in the capacitor C72 is re-distributed between the capacitor C71 and the capacitor C72, and on the signal output terminal TOS7 there appears an output voltage in accordance with the value of the voltage applied to the signal input terminal TIS7 and the ratio in capacitance between the capacitor C71 and the capacitor C72.

In the prior art amplification circuit mentioned above, since the internal current source circuit internally contained in the differential operational amplifier is connected to the output of the constant current source circuit, and therefore, since the slew rate of the differential operational amplifier changes in accordance with the value of the current flowing through the internal current source circuit, a constant current source circuit capable of giving a large current is always required in order to temporarily obtain a large slew rate. Namely, in order to maintain the large slew rate, a consumed electric power of the circuit inevitably increases.

SUMMARY OF THE INVENTION

Accordingly, it is an object of the present invention to provide an amplification circuit which has overcome the above mentioned defect of the conventional one.

Another object of the present invention is to provide an amplification circuit composed of a differential operation amplifier internally containing a current source circuit which can temporarily increase the current value only when a large slew rate is required, but can maintain the current value at a small value when a large slew rate is not required.

The above and other objects of the present invention are achieved in accordance with the present invention by an amplification circuit that comprises:

a differential operational amplifier internally containing a current source circuit and having a non-inverted input connected to receive a first reference voltage and an inverted input and an output terminal for outputting an output signal;

a first switch having one end connected to the inverted input of the differential operational amplifier and the other end connected to the output terminal of the differential operational amplifier;

a second switch having ore end connected to receive an input signal;

a third switch having one end connected to receive a second reference voltage and the other end connected to the other end of the second switch;

a first capacitor having one end connected to the inverted input of the differential operational amplifier and the other end connected to the output terminal of the differential operational amplifier, so that the first capacitor is connected in parallel to the first switch;

a second capacitor having one end connected to the other end of each of the second and third switches and the other end connected to the inverted input of the differential operational amplifier; and a current source generating circuit of a differential type having a pair of signal inputs connected to the non-inverted input and the inverted input of the differential operational amplifier, respectively, an output voltage of the current source generating circuit being voltage-fed back to the internal current source circuit of the differential operational amplifier, so as to control a slew rate of the amplification circuit.

In the above mentioned construction, a voltage difference between the non-inverted input and the inverted input of the differential operational amplifier is a voltage difference between an input signal supplied to the inverted input of the differential operational amplifier and a reference voltage supplied to the non-inverted input of the differential operational amplifier, and therefore, changes in accordance with the change of the input signal. This voltage difference is detected by the current source generation circuit in the form of a current change, and an output of the current source generation circuit is supplied to the internal current source circuit so as to obtain the slew rate in accordance with the voltage difference.

In one preferred embodiment, the current source generating circuit comprises:

first and second current sources each of which has one end connected to a first power supply terminal;

a first semiconductor device having a first electrode connected to the other end of the first current source, a second electrode connected to receive a first signal on one of the non-inverted input and the inverted input of the differential operational amplifier, and a third electrode;

a second semiconductor device having a first electrode connected to the other end of the first current source, a second electrode connected to receive a second signal on the other of the non-inverted input and the inverted input of the differential operational amplifier, and a third electrode connected to an output of the current source generating circuit;

a third semiconductor device having a first electrode connected to the other end of the second current source, a second electrode connected to receive the second signal and a third electrode connected to the third electrode of the first semiconductor device;

a fourth semiconductor device having a first electrode connected to the other end of the second current source, a second electrode connected to receive the first signal and a third electrode connected to the output of the current source generating circuit, a fifth semiconductor device having a first electrode connected to a second power supply terminal and second and third electrodes connected in common to the third electrode of each of the first and third semiconductor device; and a sixth semiconductor device having a first electrode connected to the second power supply terminal and second and third electrodes connected in common to the third electrode of each of the second and fourth semiconductor device and the output of the current source generating circuit.

In another preferred embodiment, the current source generating circuit comprises:

a first current source having one end connected to a first power supply terminal;

a first semiconductor device having a first electrode connected to the other end of the first current source, a second electrode connected to receive a first signal on one of the non-inverted input and the inverted input of the differential operational amplifier, and a third electrode;

a second semiconductor device having a first electrode connected to the other end of the first current source, a second electrode connected to receive a second signal on the other of the non-inverted input and the inverted input of the differential operational amplifier, and a third electrode;

a third semiconductor device having a first electrode connected to the third electrode of the second semiconductor device, a second electrode connected to receive the second signal and a third electrode connected to the third electrode of the first semiconductor device;

a fourth semiconductor device having a first electrode connected to the third electrode of the second semiconductor device, and a second electrode connected to receive the first signal;

a fifth semiconductor device having a first electrode connected to a second power supply terminal and second and third electrodes connected in common to the third electrode of each of the first and third semiconductor device and the output of the current source generating circuit.

The above and other objects, features and advantages of the present invention will be apparent from the following description of preferred embodiments of the invention with reference to the accompanying drawings.

DESCRIPTION OF THE PREFERRED EMBODIMENTS

Figure 2A:
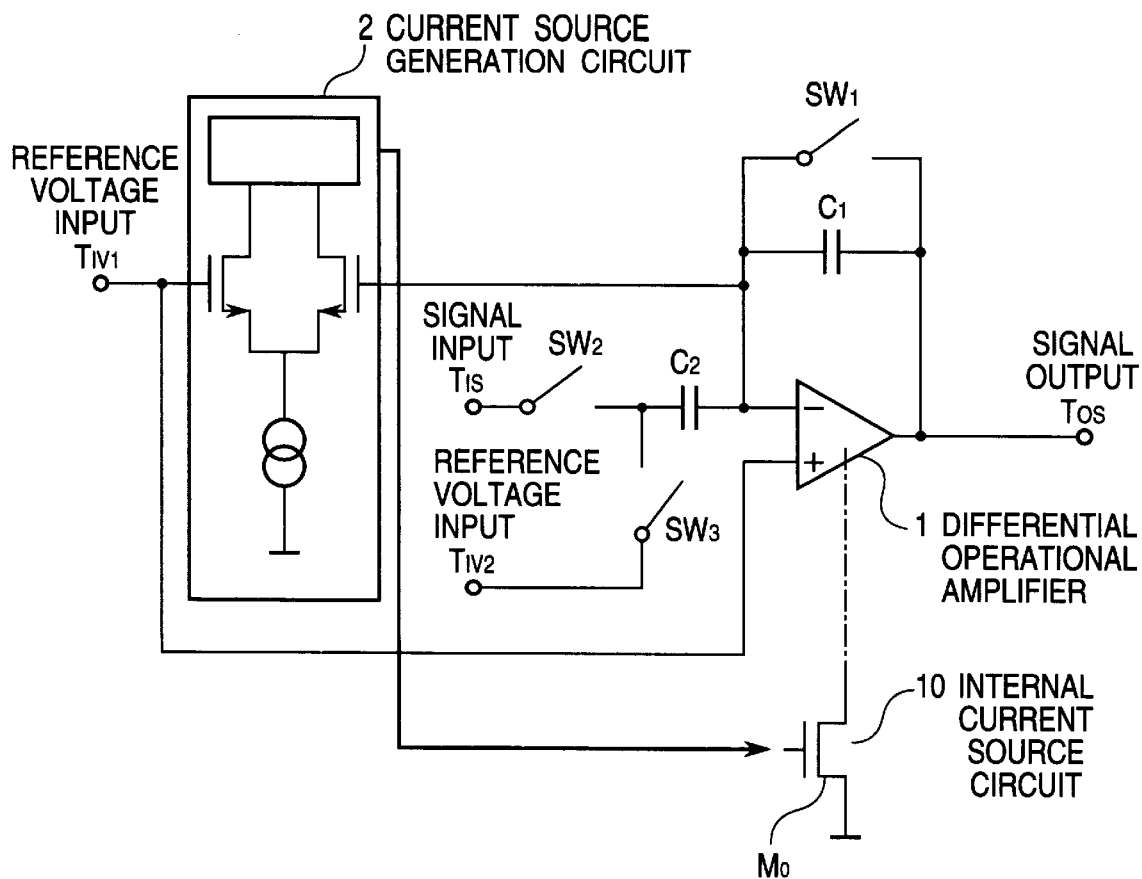
FIG. 2A is a circuit diagram of one embodiment of the amplification circuit in accordance with the present invention composed of the differential operational amplifier internally containing the current source circuit.

Referring to FIG. 2A, there is shown a circuit diagram of one embodiment of the amplification circuit in accordance with the present invention composed of the differential operational amplifier internally containing the current source circuit.

The amplification circuit shown in FIG. 2A comprises a differential operational amplifier 1 internally containing a current source circuit 10 switches SW1 to SW3, and capacitors C1 and C2, as basic amplification circuit elements. In order to control a slew rate of the amplification circuit, a current source generation circuit 2 is connected to the internal current source circuit 10. In addition, the shown amplification circuit comprises a signal input terminal TIS for receiving an input signal, a signal output terminal TOS for outputting an output signal, and reference voltage input terminals TIV1 and TIV2 for receiving two reference voltages, respectively.

Figure 1:
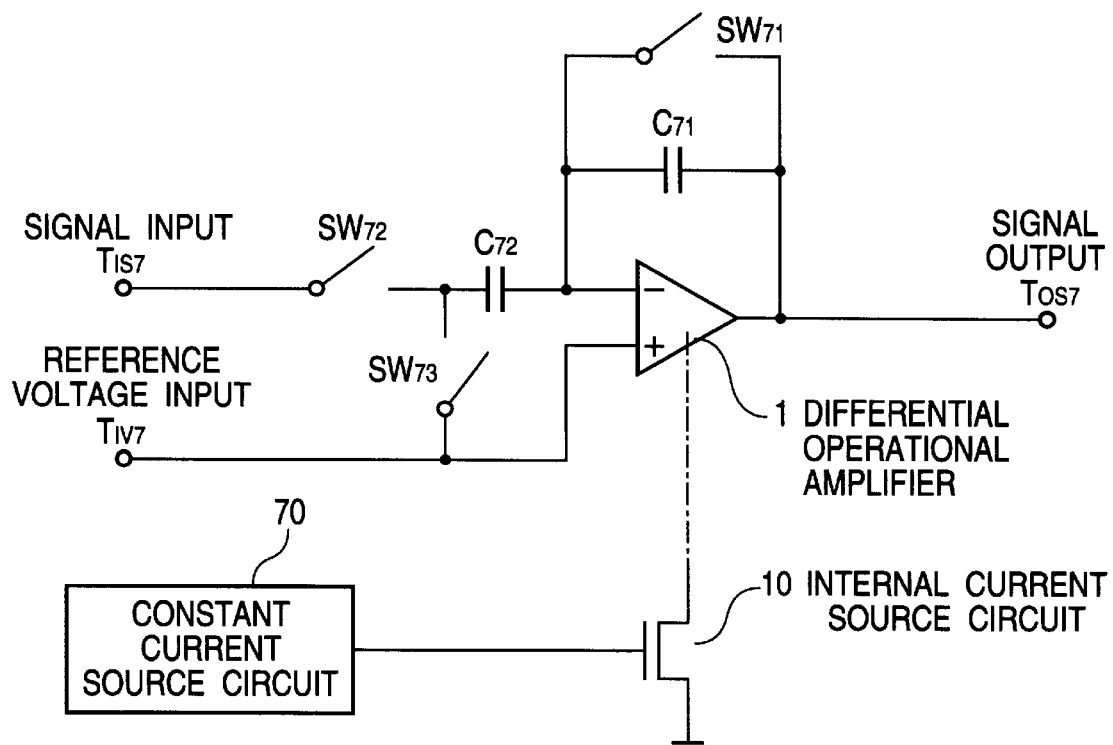
FIG. 1 is a circuit diagram of the prior art amplification circuit composed of the differential operational amplifier internally containing the current source circuit.

The shown embodiment is different from the prior art example shown in FIG. 1 in that a non-inverted input of the differential operational amplifier 1 is connected to the reference voltage input terminal TIV1, which is different from the reference voltage input terminal TIV2 connected to an inverted input of the differential operational amplifier 1 through a series circuit composed of the switch SW3 and the capacitor C2, and in that there is provided the current source generation circuit 2 in order to control the slew rate of the amplification circuit.

As the basic amplification circuit, similarly to the prior art example, the differential operational amplifier 1 includes the internal current source circuit 10. The inverted input and an output of the differential operational amplifier 1 are interconnected through a parallel circuit composed of the switch SW1 and the capacitor C1. The inverted input of the differential operational amplifier 1 is connected to one end of the capacitor C2 having the other end connected to the signal input terminal TIS through the switch SW2 in series to the capacitor C2. The non-inverted input of the differential operational amplifier 1 is connected to the reference voltage input terminal TIV1, and the output of the differential operational amplifier 1 is connected to the output terminal TOS. The switch SW3 is connected between the reference voltage input terminal TIV2 and the other end of the capacitor C72. Thus, the basic amplification circuit is constructed.

As a slew rate control circuit for controlling the slew rate of this amplification circuit, the current source generation circuit 2 is of a differential type and has two inputs connected to the non-inverted input and the inverted input of the differential operational amplifier 1, respectively, so that the current source generation circuit 2 supplies a voltage value corresponding to a voltage difference between the inputs, to the internal current source circuit 10 of the differential operational amplifier 1.

Figure 2B:
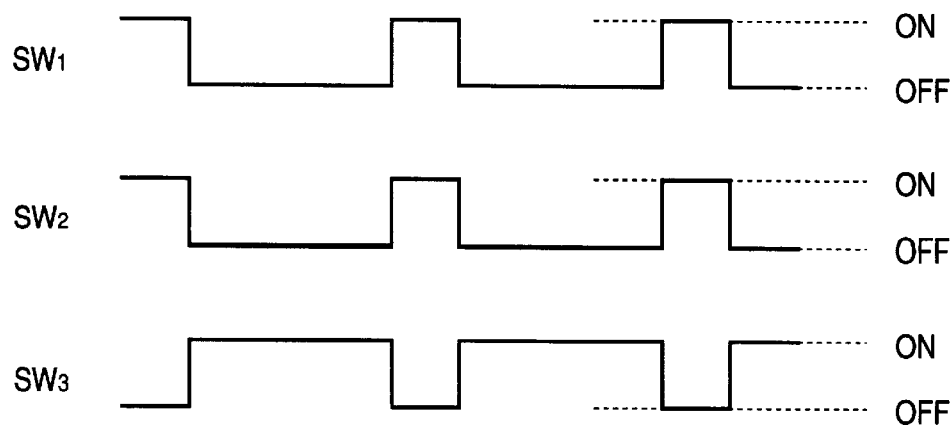
FIG. 2B is a timing chart illustrating the operation of the switches included in the circuit shown in FIG. 2A.

Now, operation of the shown amplification circuit will be described with reference to FIG. 2A and FIG. 2B which is a timing chart illustrating the operation of the switches included in the circuit shown in FIG. 2A.

When the switches SW1 and SW2 are in an ON condition and the switch SW3 is an OFF condition, the capacitor C1 is reset, and the capacitor C2 is charged with electric charges of the amount corresponding to an input voltage applied to the signal input terminal TIS.

If the switches SW1 and SW2 are brought into an OFF condition and the switch SW3 is brought into an ON condition, the electric charge stored in the capacitor C2 is re-distributed between the capacitor C1 and the capacitor C2, so that on the signal output terminal TOS there appears an output voltage in accordance with the value of the voltage applied to the signal input terminal TIS and the ratio in capacitance between the capacitor C1 and the capacitor C2.

In the above mentioned operation, ordinarily, namely, in a steady period, since the inverted input of the differential operational amplifier 1 is a virtual ground, the inverted input is at the same voltage as that applied to the reference voltage input terminal TIV1 connected to the non-inverted input of the differential operational amplifier 1. Here, it is so set that when the voltages of the inverted input and the non-inverted input of the differential operational amplifier 1 are the same as mentioned above, the output voltage of the current source generation circuit 2 is at a degree of causing the internal current source circuit 10 to supply a minimum current allowing the differential operational amplifier 1 to operate.

On the other hand, the case that a large slew rate is required in the differential operational amplifier 1 includes a first transient case that the switch SW1 is closed to reset the capacitor C1 and a second transient case that the switch SW1 is opened to allow the signal to be outputted through the signal output terminal TOS.

First, when the switch SW1 is closed, the transfer of the electric charge occurs, so that the voltage of the inverted input of the differential operational amplifier 1 temporarily changes. In response to a voltage difference generated by this change of the voltage, the differential operational type current source generation circuit 2 becomes unbalanced, so that the voltage supplied to the internal current source circuit 10 (namely, the voltage applied to a gate of a transistor M0 constituting the internal current source) changes to elevate or to drop. As a result, the value of the current flowing through the internal current source circuit 10 (namely, through the transistor M0) temporarily increases to elevate the slew rate of the differential operational amplifier 1.

When the switch SW1 is opened, similarly to the case that the switch SW1 is closed, the transfer of the electric charge occurs, so that the voltage of the inverted input of the differential operational amplifier 1 temporarily changes. In response to a voltage difference generated by this change of the voltage,. the differential operational type current source generation circuit 2 becomes unbalanced, so that the voltage supplied to the internal current source circuit 10 changes to elevate or to drop. As a result, the value of the current flowing through the internal current source circuit 10 temporarily increases to elevate the slew rate of the differential operational amplifier 1.

In these cases, the voltage of the inverted input of the differential operational amplifier 1 which had charged, becomes the same value as the voltage value applied to the reference voltage input terminal TIV1 with the lapse of the time. Therefore, the output voltage of the current source generation circuit 2 finally becomes stable at a voltage value which causes the internal current source circuit 10 to supply a minimum current allowing the differential operational amplifier 1 to operate.

As mentioned above, there is realized the amplification circuit so configured that the current value of the internal current source circuit internally provided in the amplification circuit for changing the slew rate of the amplification circuit can be controlled on the basis of the output voltage value of the current source generation circuit, so as to maintain the slew rate at a small value in the ordinary cases and to temporarily make the slew rate large when a large slew rate is required.

Here, in the circuit shown in FIG. 2A, not only when the potential of the inverted input of the differential operational amplifier 1 (having the inverted input interconnected to the output by the parallel circuit composed of the switch SW1 and the capacitor C1 and also connected to the one end of the capacitor C2 having the other end connected through the switch SW2 to the signal input terminal TIS) elevates in comparison with the reference voltage value applied to the non-inverted input of the differential operational amplifier 1, but also when the potential of the inverted input of the differential operational amplifier 1 drops in comparison with the reference voltage value applied to the non-inverted input of the differential operational amplifier 1, the output of the current source generation circuit must change only in one direction, namely, has to either elevate or drop.

Now, one example of the current source generation circuit included in the circuit shown in FIG. 2A will be described with reference to FIG. 3.

Figure 3:
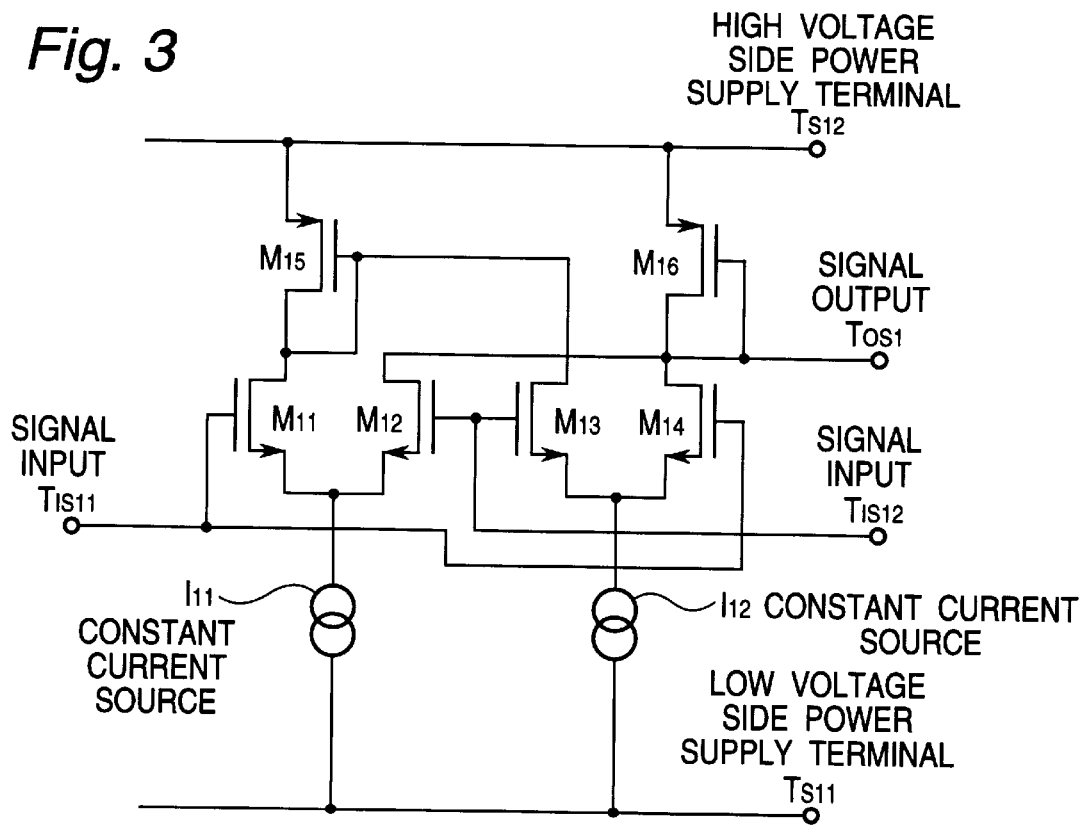
FIG. 3 is a circuit diagram of one example of the current source generation circuit included in the circuit shown in FIG. 2A.

The shown example of the current source generation circuit includes constant current sources I11 and I12, MOS transistors M11 to M16, signal input terminals TIS11 and TIS12, a low voltage side power supply terminal TS11, a high voltage side power supply terminal TS12, and a signal output terminal TOS1, as shown in FIG. 3. One of the signal input terminals TIS11 and TIS12 is connected to one of the non-inverted input and the inverted input of the differential operational amplifier, and the other of the signal input terminals TIS11 and TIS12 is connected to the other of the non-inverted input and the inverted input of the differential operational amplifier.

The constant current source I11 has one end connected to the low voltage side power supply terminal TS11, and the other end connected to a source of each of the transistors M11 and M12. Similarly, the constant current source I12 has one end connected to the low voltage side power supply terminal TS11, and the other end connected to a source of each of the transistors M13 and M14.

The transistor M11 has the source connected to the other end of the constant current source I11 and the source of the transistor M12 as mentioned above, a gate connected to a gate of the transistor M14 and the signal input terminal TIS11, and a drain connected to a drain of the transistor M13 and a gate and a drain of the transistor M15.

The transistor M12 has the source connected to the other end of the constant current source I11 and the source of the transistor M11 as mentioned above, a gate connected to a gate of the transistor M13 and the signal input terminal TIS12, and a drain connected to a drain of the transistor M14 and a gate and a drain of the transistor M16.

The transistor M13 has the source connected to the other end of the constant current source I12 and the source of the transistor M14, the gate connected to the gate of the transistor M12 and the signal input terminal TIS12, and the drain connected to the drain of the transistor M11 and the gate and the drain of the transistor M15.

The transistor M14 has the source connected to the other end of the constant current source I12 and the source of the transistor M13, the gate connected to the gate of the transistor M11 and the signal input terminal TIS11, and the drain connected to the drain of the transistor M12, the gate and the drain of the transistor M16 and the signal output terminal TOS1.

The transistor M15 has a source connected to the high voltage side power supply terminal TS12, and the gate and the drain connected to the drain of each of the transistor M11 and the transistor M13.

The transistor M16 has a source connected to the high voltage side power supply terminal TS12, and the gate and the drain connected to the drain of each of the transistor M12 and the transistor M14 and the signal output terminal TOS1.

In this structure, in order to realize the above mentioned effect that not only when the potential of the inverted input of the differential operational amplifier elevates in comparison with the reference voltage value applied to the non-inverted input of the differential operational amplifier 1, but also when the potential of the inverted input of the differential operational amplifier 1 drops in comparison with the reference voltage value applied to the non-inverted input of the differential operational amplifier 1, the output of the current source generation circuit must change in only one direction of an elevating direction and a dropping direction, the transistors M11 to M16 are required to have a predetermined size ratio, which will be now described.

For example, here, assume that the size ratio of M11 to M12 and the size ratio of M13 to M14 are set to be "9:1" and "9:1", respectively. In a steady condition under this setting, assuming that the current flowing through the transistor M14 is "1", the ratio of the current value flowing through the transistor M15 to the current value flowing through the transistor M16 becomes "18:2".

In this condition, when the balance in the input voltage between the signal input terminals TIS11 and TIS12 becomes unbalanced, the ratio of the current value flowing through the transistor M15 to the current value flowing through the transistor M16 changes to "10:10" from "18:2" in order to restore the balance. Here, since the total value of the current value flowing through the transistor M15 and the current value flowing through the transistor M16 is at a constant, the current value flowing through the transistor M16 increases to the proportion "10" from the proportion "2". Accordingly, when the signal input voltage elevates or drops in comparison with the reference voltage to destroy the balanced condition, the output voltage on the signal output terminal TOS1 drops in comparison with the voltage when the balanced condition is maintained, with the result that the current flowing. In the MOS transistor M0 of the internal current source circuit 10 correspondingly increases.

Next, a specific operation of the amplification circuit shown in FIG. 2A will be described with reference to FIGS. 2A and 3.

Here, it is assumed that the size ratio of M11 to M12 and the size ratio of M13 to M14 are set to be "9:1" and "9:1" respectively. It is also assumed that, under this setting, a current of 100 $\mu$A is caused to flow through the internal current source circuit 10 in a steady condition, and the slew rate of $\alpha$ (V/$\mu$sec) is obtained. Furthermore, it is assumed that each of the constant current sources I11 and I12 allows a current of 10 $\mu$A to flow therethrough. In this condition, an overall consumed current value is 120 $\mu$A (=100 $\mu$A+10 $\mu$A×2).

In this condition in the transistor M16, there flows only a current of 2 $\mu$A (={sum of respective current values of M12 and M14}=10 $\mu$A×{1/(9+1)}×2). Accordingly, the size ratio of the transistor M16 to a transistor of the internal current source circuit 10 is required to be "1:50", which corresponds to the current ratio between the transistor M16 and the transistor M0 of the internal current source circuit 10, namely, "2 $\mu$A:100 $\mu$A". Namely, the transistor M16 and the transistor M0 (of the internal current source circuit 10) constitutes a current mirror circuit.

When the signal input changes so that the input voltage of the inverted input of the differential operation amplifier correspondingly changes, namely, when the balance between the two inputs of the differential operation amplifier becomes unbalanced, the value of the current flowing through the transistor M16 temporarily becomes 10 $\mu$A. Therefore, through the transistor M0 (of the internal current source circuit 10) having the size ratio of 50 times, the current of 500 $\mu$A temporarily flows. At this time, the slew rate becomes five times, namely, "5= (V/$\mu$sec)".

In the prior art circuit shown in FIG. 1, in order to obtain the slew rate of "5$\alpha$ (V/$\mu$sec)" when the signal input changes so that the input voltage of the inverted input of the differential operation amplifier correspondingly changes, it was necessary to cause the current of 500 $\mu$A to ceaselessly flow through the internal current source circuit. Accordingly, the above mentioned embodiment can reduce the consumed current by 380 $\mu$A (=500 $\mu$A–120 $\mu$A), namely, by about 75% (=380 $\mu$A/500 $\mu$A).

Now, a second example of the current source generation circuit included in the circuit shown in FIG. 2A will be described with reference to FIG. 4.

Figure 4:
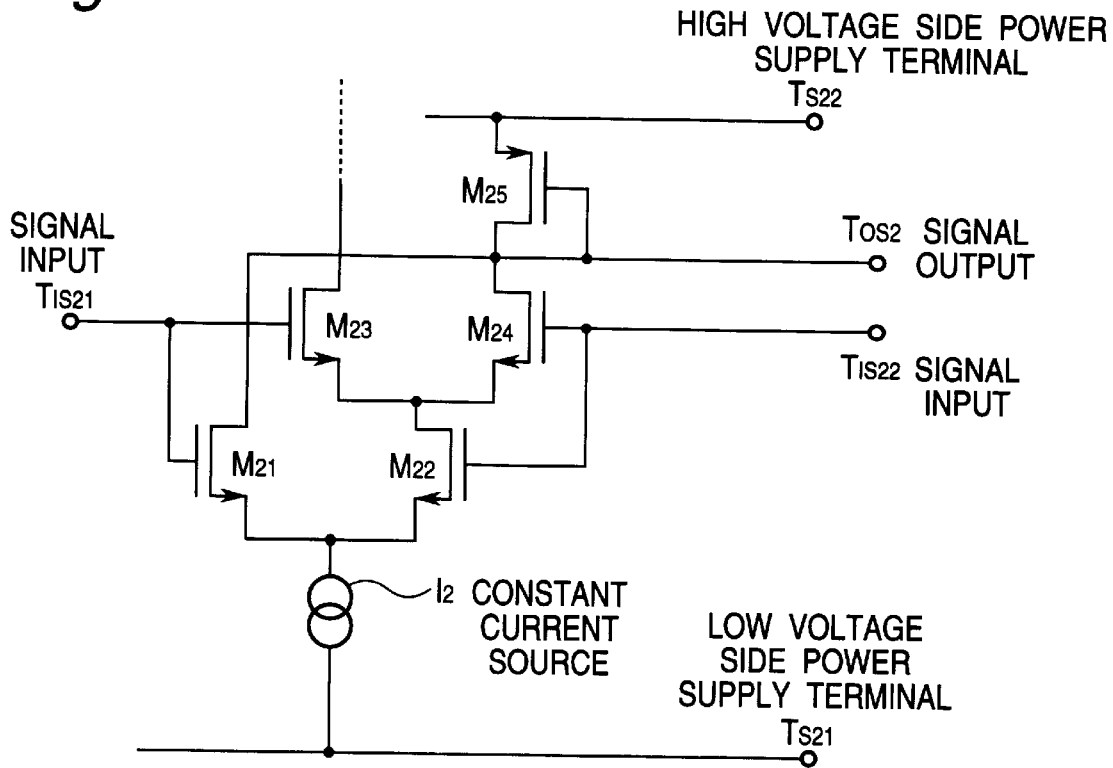
FIG. 4 is a circuit diagram of a second example of the current source generation circuit included in the circuit shown in FIG. 2A.

The shown second example of the current source generation circuit includes a constant current source I2, MOS transistors M21 to M25, signal input terminals TIS21 and TIS22, a low voltage side power supply terminal TS21, a high voltage side power supply terminal TS22, and a signal output terminal TOS2, as shown in FIG. 4. One of the signal input terminals TIS21 and TIS22 is connected to one of the non-inverted input and the inverted input of the differential operational amplifier, and the other of the signal input terminals TIS21 and TIS22 is connected to the other of the non-inverted input and the inverted input of the differential operational amplifier.

The constant current source 12 has one end connected to the low voltage side power supply terminal TS21, and the other end connected to a source of each of the transistors M21 and M22.

The transistor M21 has the source connected to the other end of the constant current source I2 and the source of the transistor M22 as mentioned above, a gate connected to a gate of the transistor M23 and the signal input terminal TIS21, and a drain connected to a drain of the transistor M24, a gate and a drain of the transistor M25 and the signal output terminal TOS2.

The transistor M22 has the source connected to the other end of the constant current source I2 and the source of the transistor M21 as mentioned above, a gate connected to a gate of the transistor M24 and the signal input terminal TIS21, and a drain connected to a source of each of the transistor M23 and the transistor M24.

The transistor M23 has the source connected to the drain of the transistor M22 and the source of the transistor M24, and the gate connected to the gate of the transistor M21 and the signal input terminal TIS21.

The transistor M24 has the source connected to the drain of the transistor M22 and the source of the transistor M23, the gate connected to the gate of the transistor M22 and the signal input terminal TIS22, and the drain connected to the drain of the transistor M21, the gate and the drain of the transistor M25 and the signal output terminal TOS2.

The transistor M25 has a source connected to the high voltage side power supply terminal TS22, and the gate and the drain connected to the drain of each of the transistor M21 and the transistor M24 and the signal output terminal TOS2.

In this structure, in order to realize the above mentioned effect that not only when the potential of the inverted input of the differential operational amplifier elevates in comparison with the reference voltage value applied to the non-inverted input of the differential operational amplifier 1, but also when the potential of the inverted input of the differential operational amplifier 1 drops in comparison with the reference voltage value applied to the non-inverted input of the differential operational amplifier 1, the output of the current source generation circuit must change in only one direction of an elevating direction and a dropping direction, the transistors M21 to M25 are required to have a predetermined size ratio, which will be now described.

For example, here, assume that the size ratio of M21 to M22 is set to be "1:9" and the size ratio of M23 to M24 is set to be "8:1". In a steady condition under this setting, the current flowing through the transistor M25 becomes "2", from the size ratio of transistor M21 and the transistor M24.

In this condition, when the balance in the input voltage between the signal input terminals TIS21 and TIS22 becomes unbalanced, the current value flowing through each of the transistors M21 and M24 becomes "5" in order to restore the balance, and therefore, the current value flowing through the transistor M25 increases to "10" from "2". Namely, the current value flowing through the transistor M25 increases to the proportion "10" from the proportion "2".

Accordingly, when the signal input voltage elevates or drops in comparison with the reference voltage to destroy the balanced condition, the output voltage on the signal output terminal TOS2 drops in comparison with the voltage when the balanced condition is maintained. Therefore, a large consumed current reduction can be expected similarly to the embodiment explained hereinbefore with reference to FIGS. 2A and 3.

Figure 5:
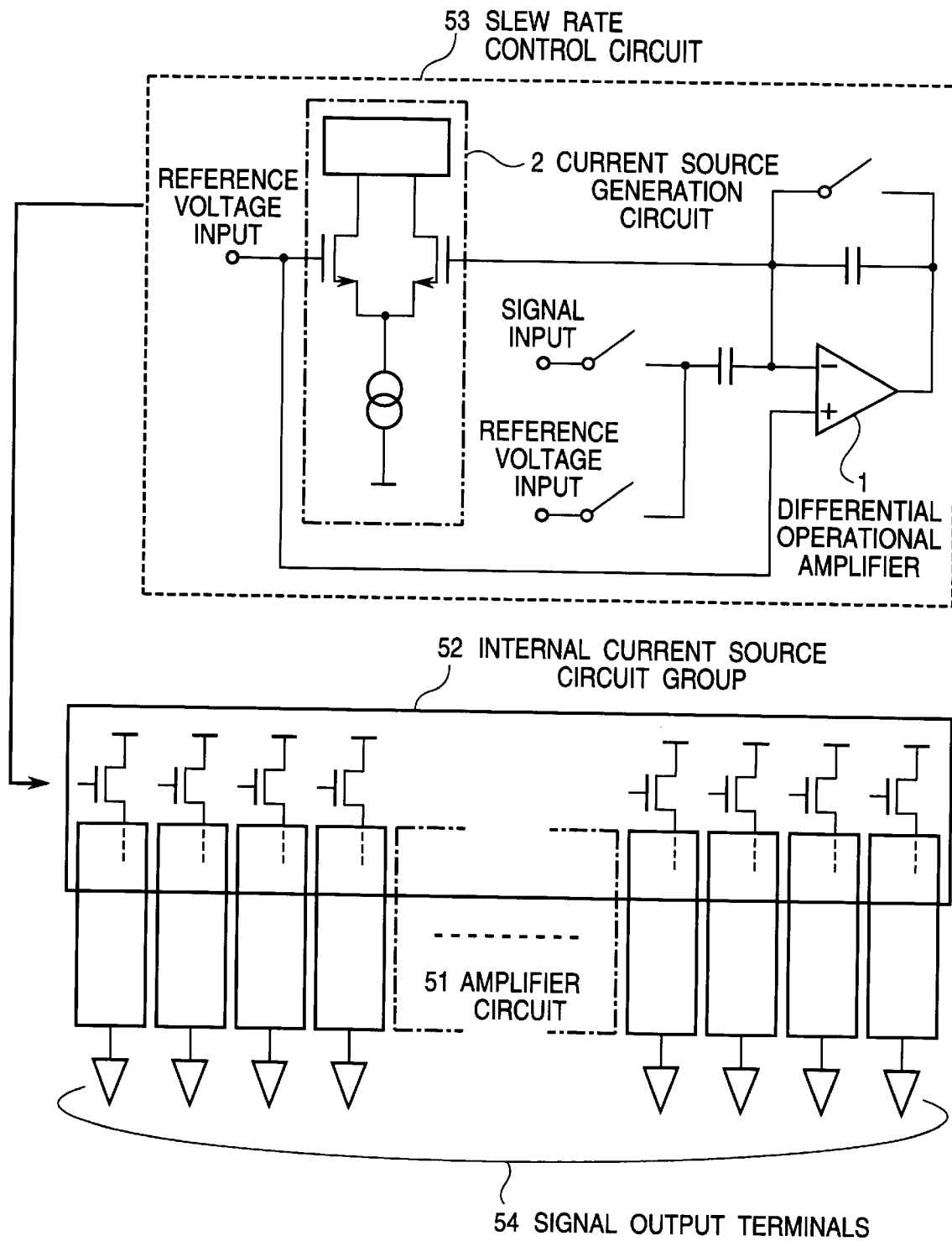
FIG. 5 is a circuit diagram of a multi-output circuit incorporating therein the circuit shown in FIG. 2A.

If the above mentioned current source generation circuit is connected to each of a group of internal current source circuits 52 which are associated in a plurality of amplifier circuits 51 as shown in FIG. 5 as a slew rate control circuit 53 for controlling the current flowing through each of the internal current source circuits 52, a multi-output circuit having a plurality of signal output terminals 54 can be constituted.

As seen from the above, according to the present invention, there can be realized the amplification circuit so configured that, when the input signal applied to the inverted input of the differential operational amplifier changes to cause a difference in voltage between the inverted input of the differential operational amplifier and the non-inverted input of the differential operational amplifier connected to the reference voltage, the current source generating circuit having the output connected to the internal current source circuit of the differential operational amplifier and having a pair of inputs receiving the respective voltages on the inverted input and the non-inverted input of the differential operational amplifier, detects an unbalance which has occurred between the inverted input and the non-inverted input of the differential operational amplifier, and to increase the output current of the internal current source circuit, whereby the slew rate of the amplification circuit can be controlled.

In this construction, only when the current source generating circuit detects the unbalance in the input voltage between the inverted input and the non-inverted input of the differential operational amplifier, the output voltage of the current source generating circuit increases, and the internal current source circuit receiving the output voltage of the current source generating circuit increases the current, so that the slew rate of the amplification circuit constituted of the differential operational amplifier can be elevated. Thus, only when a large slew rate is required, the current value generated by the internal current source circuit of the differential operational amplifier is temporarily increased, and when a large slew rate is not required, the current value generated by the internal current source circuit can be maintained at a small value, with the result that the consumed electric power can be reduced, and simultaneously, a good slew rate can be obtained.

The invention has thus been shown and described with reference to the specific embodiments. However, it should be noted that the present invention is in no way limited to the details of the illustrated structures but changes and modifications may be made within the scope of the appended claims.

I claim:

1. An amplification circuit comprises:
   a differential operational amplifier internally containing a current source circuit and having a non-inverted input connected to receive a first reference voltage, and having an inverted input and an output terminal for outputting an output signal;
   a first switch having one end connected to said inverted input of said differential operational amplifier and the other end connected to said output terminal of said differential operational amplifier;
   a second switch having one end connected to receive an input signal;
   a third switch having one end connected to receive a second reference voltage and the other end connected to the other end of said second switch;

a first capacitor having one end connected to said inverted input of said differential operational amplifier and the other end connected to said output terminal of said differential operational amplifier, so that said first capacitor is connected in parallel to said first switch;

a second capacitor having one end connected to the other end of each of said second and third switches and the other end connected to said inverted input of said differential operational amplifier; and a current source generating circuit of a differential type having a pair of signal inputs connected to said non-inverted input and said inverted input of said differential operational amplifier, respectively, an output of said current source generating circuit being connected to said internal current source circuit of said differential operational amplifier, so as to control a slew rate of the amplification circuit.

2. An amplification circuit claimed in claim 1 wherein said current source generating circuit comprises:

first and second current sources each of which has one end connected to a first power supply terminal;

a first semiconductor device having a first electrode connected to the other end of said first current source, a second electrode connected to receive a first signal on one of said non-inverted input and said inverted input of said differential operational amplifier, and a third electrode;

a second semiconductor device having a first electrode connected to the other end of said first current source, a second electrode connected to receive a second signal on the other of said non-inverted input and said inverted input of said differential operational amplifier, and a third electrode connected to an output of said current source generating circuit, a third semiconductor device having a first electrode connected to the other end of said second current source, a second electrode connected to receive said second signal and a third electrode connected to said third electrode of said first semiconductor device;

a fourth semiconductor device having a first electrode connected to the other end of said second current source, a second electrode connected to receive said first signal and a third electrode connected to said output of said current source generating circuit;

a fifth semiconductor device having a first electrode connected to a second power supply terminal and second and third electrodes connected in common to said third electrode of each of said first and third semiconductor device; and a sixth semiconductor device having a first electrode connected to said second power supply terminal and second and third electrodes connected in common to said third electrode of each of said second and fourth semiconductor device and said output of said current source generating circuit.

3. An amplification circuit claimed in claim 2 wherein each of said first to sixth semiconductor devices is constituted of a field effect transistor having a source electrode corresponding to said first electrode, a gate electrode corresponding to said second electrode, and a drain electrode corresponding to said third electrode.

4. An amplification circuit claimed in claim 1 wherein said current source generating circuit comprises:

a first current source having one end connected to a first power supply terminal;

a first semiconductor device having a first electrode connected to the other end of said first current source, a second electrode connected to receive a first signal on one of said non-inverted input and said inverted input of said differential operational amplifier, and a third electrode;

a second semiconductor device having a first electrode connected to the other end of said first current source, a second electrode connected to receive a second signal on the other of said non-inverted input and said inverted input of said differential operational amplifier, and a third electrode;

a third semiconductor device having a first electrode connected to said third electrode of said second semiconductor device, a second electrode connected to receive said second signal and a third electrode connected to said third electrode of said first semiconductor device;

a fourth semiconductor device having a first electrode connected to said third electrode of said second semiconductor device, and a second electrode connected to receive said first signal;

a fifth semiconductor device having a first electrode connected to a second power supply terminal and second and third electrodes connected in common to said third electrode of each of said first and third semiconductor device and said output of said current source generating circuit.

5. An amplification circuit claimed in claim 4 wherein each of said first to fifth semiconductor devices is constituted of a field effect transistor having a source electrode corresponding to said first electrode, a gate electrode corresponding to said second electrode, and a drain electrode corresponding to said third electrode.

6. An amplification circuit, comprising:

a plurality of differential operational amplifiers, each internally containing a current source circuit and having a non-inverted input connected to receive a first reference voltage, and each having an inverted input and an output terminal for outputting an output signal;

a first switch having one end connected to the inverted inputs of each of the plurality of differential operational amplifiers, and the other end connected to the output terminal of each of the plurality of operational amplifiers;

a second switch having one end connected to receive an input signal;

a third switch having one end connected to receive a second reference voltage and the other end connected to the other end of said second switch;

a first capacitor having one end connected to the inverted input of each of the plurality of operational amplifiers, and the other end connected to the output terminal of each of the plurality of differential operational amplifiers, so that said first capacitor is connected in parallel to said first switch;

a second capacitor having one end connected to the other end of each of said second and third switches and the other end connected to the inverted input of each of the plurality of differential operational amplifiers; and a current source generating circuit of a differential type having a pair of signal inputs connected respectively to the non-inverted inputs and inverted inputs of each of the plurality of differential operational amplifiers, an output of said current source generating circuit being thus connected to an internal current source circuit of each of the plurality of differential operational amplifiers, so as to control a slew rate of the amplification circuit.

7. A slew rate controlled amplification circuit comprises:
a differential operational amplifier internally containing a current source circuit and having a non-inverted input connected to receive a first reference voltage, an inverted input and an output terminal for outputting an output signal;
a first switch having one end connected to said inverted input of said differential operational amplifier and the other end connected to said output terminal of said differential operational amplifier;
a second switch having one end connected to receive an input signal;
a third switch having one end connected to receive a second reference voltage and the other end connected to the other end of said second switch;
a first capacitor having one end connected to said inverted input of said differential operational amplifier and the other end connected to said output terminal of said differential operational amplifier, so that said first capacitor is connected in parallel to said first switch;
a second capacitor having ore end connected to the other end of each of said second and third switches and the other end connected to said inverted input of said differential operational amplifier; and
a current source generating circuit of a differential type having a pair of signal inputs connected to said non-inverted input and said inverted input of said differential operational amplifier, respectively, and a signal output connected to said internal current source circuit of said differential operational amplifier.

8. A slew rate controlled amplification circuit claimed in claim 7 wherein said current source generating circuit comprises:
first and second current sources each of which has one end connected to a first power supply terminal;
a first semiconductor device having a first electrode connected to the other end of said first current source, a second electrode connected to receive a first signal on one of said non-inverted input and said inverted input of said differential operational amplifier, and a third electrode;
a second semiconductor device having a first electrode connected to the other end of said first current source, a second electrode connected to receive a second signal on the other of said non-inverted input and said inverted input of said differential operational amplifier, and a third electrode connected to an output of said current source generating circuit;
a third semiconductor device having a first electrode connected to the other end of said second current source, a second electrode connected to receive said second signal and a third electrode connected to said third electrode of said first semiconductor device;
a fourth semiconductor device having a first electrode connected to the other end of said second current source, a second electrode connected to receive said first signal and a third electrode connected to said output of said current source generating circuit;
a fifth semiconductor device having a first electrode connected to a second power supply terminal and second and third electrodes connected in common to said third electrode of each of said first and third semiconductor device; and
a sixth semiconductor device having a first electrode connected to said second power supply terminal and second and third electrodes connected in common to said third electrode of each of said second and fourth semiconductor device and said output of said current source generating circuit.

9. A slew rate controlled amplification circuit claimed in claim 8 wherein each of said first to sixth semiconductor devices is constituted of a field effect transistor having a source electrode corresponding to said first electrode, a gate electrode corresponding to said second electrode, and a drain electrode corresponding to said third electrode.

10. A slew rate controlled amplification circuit claimed in claim 7 wherein said current source generating circuit comprises:
a first current source having one end connected to a first power supply terminal;
a first semiconductor device having a first electrode connected to the other end of said first current source, a second electrode connected to receive a first signal on said non-inverted input of said differential operational amplifier, and a third electrode;
a second semiconductor device having a first electrode connected to the other end of said first current source, a second electrode connected to receive a second signal on said inverted input of said differential operational amplifier, and a third electrode;
a third semiconductor device having a first electrode connected to said third electrode of said second semiconductor device, a second electrode connected to receive said second signal and a third electrode connected to said third electrode of said first semiconductor device;
a fourth semiconductor device having a first electrode connected to said third electrode of said second semiconductor device, and a second electrode connected to receive said first signal;
a fifth semiconductor device having a first electrode connected to a second power supply terminal and second and third electrodes connected in common to said third electrode of each of said first and third semiconductor device and said output of said current source generating circuit.

11. A slew rate controlled amplification circuit claimed in claim 10 wherein each of said first to fifth semiconductor devices is constituted of a field effect transistor having a source electrode corresponding to said first electrode, a gate electrode corresponding to said second electrode, and a drain electrode corresponding to said third electrode.

12. A slew rate controlled amplification circuit, comprising:
a plurality of differential operational amplifiers each internally containing a current source circuit and each having a non-inverted input connected to receive a first reference voltage, and each having an inverted input and an output terminal for outputting an output signal;
a first switch having one end connected to the inverted input of each of the plurality of differential operational amplifiers, and having the other end connected to the output terminal of each of the plurality of differential operational amplifiers;

a second switch having one end connected to receive an input signal;

a third switch having one end connected to receive a second reference voltage and the other end connected to the other end of said second switch;

a first capacitor having one end connected to the inverted input of each of the plurality of differential operational amplifiers, and having the other end connected to the output terminal of each of the plurality of differential operational amplifiers, so that said first capacitor is connected in parallel to said first switch;

a second capacitor having one end connected to the other end of each of said second and third switches and the other end connected to the inverted input of each of the plurality of differential operational amplifiers; and a current source generating circuit of a differential type having a pair of signal inputs respectively connected to the non-inverted input and the inverted input of each of the differential operational amplifiers, and a signal output connected to the internal current source circuit of each of the differential operational amplifiers.

* * * * *